(12) United States Patent
Rubinsztain et al.

(10) Patent No.: US 11,768,259 B1
(45) Date of Patent: Sep. 26, 2023

(54) MULTICHANNEL MAGNETIC FIELD SENSOR WITH MULTIPLEXED SIGNAL PATH

(71) Applicant: Allegro MicroSystems, LLC, Manchester, NH (US)

(72) Inventors: Ezequiel Rubinsztain, Buenos Aires (AR); Pablo Javier Bolsinger, Buenos Aires (AR)

(73) Assignee: Allegro MicroSystems, LLC, Manchester, NH (US)

(*) Notice: Subject to any disclaimer, the term of this patent is extended or adjusted under 35 U.S.C. 154(b) by 0 days.

(21) Appl. No.: 17/930,463

(22) Filed: Sep. 8, 2022

(51) Int. Cl.
  *G01R 33/07* (2006.01)
  *H03F 3/45* (2006.01)
  *G01R 33/00* (2006.01)

(52) U.S. Cl.
  CPC ......... *G01R 33/07* (2013.01); *G01R 33/0041* (2013.01); *H03F 3/45977* (2013.01)

(58) Field of Classification Search
  CPC .. G01R 33/07; G01R 33/0041; H03F 3/45977
  See application file for complete search history.

(56) References Cited

U.S. PATENT DOCUMENTS

| | | | |
|---|---|---|---|
| 7,605,647 B1 | 10/2009 | Romero et al. | |
| 7,990,209 B2 | 8/2011 | Romero | |
| 8,416,014 B2 | 4/2013 | Romero | |
| 9,804,222 B2 | 10/2017 | Petrie et al. | |
| 10,451,671 B2 | 10/2019 | Petrie et al. | |
| 10,466,298 B2 | 11/2019 | Chaware et al. | |
| 10,746,814 B2 | 8/2020 | Rubinsztain et al. | |
| 10,866,289 B2 | 12/2020 | Cook | |
| 10,873,320 B2 | 12/2020 | Procházka | |
| 11,333,718 B2 | 5/2022 | Ronis et al. | |
| 2014/0043085 A1* | 2/2014 | Motz | G01R 33/07 327/307 |
| 2019/0391212 A1* | 12/2019 | Rubinsztain | G01R 33/0029 |
| 2020/0025837 A1* | 1/2020 | Rubinsztain | G08B 21/185 |
| 2020/0309866 A1* | 10/2020 | Rubinsztain | G01R 33/0023 |
| 2020/0386575 A1* | 12/2020 | Weiland | G01V 3/081 |
| 2021/0218317 A1* | 7/2021 | Metivier | H02P 29/024 |
| 2022/0196739 A1 | 6/2022 | Rubinsztain et al. | |

OTHER PUBLICATIONS

Allegro MicroSystems, LLC, "A1262 Datasheet, 2D Dual-Channel Ultrasensitive Hall-Effect Latch", Nov. 18, 2020, 21 pages

* cited by examiner

*Primary Examiner* — Alvaro E Fortich
(74) *Attorney, Agent, or Firm* — DALY, CROWLEY, MOFFORD & DURKEE, LLP

(57) ABSTRACT

A multichannel magnetic field sensor including a plurality of magnetic field sensing elements includes a multiplexed signal path. A front end amplifier is coupled to receive a first magnetic field signal during a first time interval and a second magnetic field signal during a second time interval. A first low pass filter processes the amplified signal during the first time interval and a second low pass filter processes the amplified signal during the second time interval. A sinc filter is coupled to receive the first low pass filtered signal during the first time interval and the second low pass filtered signal during the second time interval. A Schmitt trigger circuit includes a comparator to process the sinc filter output signal and to generate a first comparator output signal during the first time interval and a second comparator output signal is provided during the second time interval.

17 Claims, 5 Drawing Sheets

MULTICHANNEL MAGNETIC FIELD SENSOR WITH MULTIPLEXED SIGNAL PATH

FIELD

The present disclosure relates generally to magnetic field sensors having more than one channel and a multiplexed signal path.

BACKGROUND

As is known, sensors are used to perform various functions in a variety of applications. Some sensors include one or more magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Magnetic field sensors, which use magnetic field sensing elements, are used in a variety of applications, including, but not limited to, current sensors that sense magnetic fields generated by currents in a conductor, magnetic switches, proximity detectors that sense the proximity of ferromagnetic or magnetic objects, rotation detectors that sense passing ferromagnetic articles such as gear teeth, and magnetic field density sensors.

In magnetic field sensors including multiple magnetic field sensing elements, magnetic field signals from the sensing elements can be processed by separate processing channels. Example applications of multichannel sensors include differential sensors, angle sensors, speed sensors, two-dimensional sensors, and three-dimensional position sensors. Speed of operation of sensors and circuit area can be important specifications depending on the application.

Some magnetic field sensing elements, such as Hall Effect elements, exhibit an undesirable DC offset voltage. Techniques have been developed to reduce the DC offset voltage, while still allowing the Hall Effect element to sense a DC magnetic field. One such technique is commonly referred to as "chopping" or "current spinning" and entails driving a Hall Effect element in two or more different directions during different portions (e.g., phases) of a clock cycle and receiving output signals at different output terminals of the Hall Effect element during the different portions of the clock cycle. In this way, drive, or power terminals and output terminals are interchanged during each phase of the chopping and offset voltages of the different driving arrangements tend to cancel.

SUMMARY

The present disclosure provides a multichannel magnetic field sensor that has a multiplexed signal path. In particular, a front end amplifier and portions of a Schmitt trigger circuit are shared. The sensor includes separate low pass filters and separate sinc filter sampling capacitors for each channel. This arrangement provides an increased operating speed as compared to a fully shared signal path (i.e., a signal path in which all elements are shared in a multiplexed manner) and lower cost and reduced circuit area as compared to use of fully separate, redundant signal paths for each channel.

According to the disclosure, a magnetic field sensor includes a plurality of magnetic field sensing elements, each configured to generate a respective magnetic field signal indicative of a sensed magnetic field and a front end amplifier. The front end amplifier is coupled to receive a first magnetic field signal during a first time interval when a first one of the plurality of magnetic field sensing elements is coupled to the front end amplifier and to receive a second magnetic field signal during a second time interval when a second one of the plurality of magnetic field sensing elements is coupled to the front end amplifier, wherein the second time interval does not overlap with the first time interval, and wherein the front end amplifier is configured to generate an amplified signal. A first low pass filter is configured to process the amplified signal during the first time interval and generate a first low pass filtered signal and a second low pass filter is configured to process the amplified signal during the second time interval and generate a second low pass filtered signal. A sinc filter has a first input coupled to receive the first low pass filtered signal during the first time interval and a second input coupled to receive the second low pass filtered signal during the second time interval, and an averaging element that is configured to generate an averaged signal based on the first and second low pass filtered signals. A Schmitt trigger circuit includes a comparator having a first input coupled to receive the averaged signal, a second input coupled to receive a reference signal, and an output at which a first comparator output signal is provided during the first time interval and a second comparator output signal is provided during the second time interval.

Features may include one or more of the following individually or in combination with other features. The sinc filter may include at least one first sampling capacitor, at least one first filter switch configured to be closed to couple the first low pass filtered signal to the at least one first sampling capacitor or to be open to decouple the first low pass filtered signal from the at least one first sampling capacitor, at least one second sampling capacitor, and at least one second filter switch configured to be closed to couple the second low pass filtered signal to the at least one second sampling capacitor or to be open to decouple the second low pass filtered signal from the at least one second sampling capacitor. The magnetic field signal generated by each of the magnetic field sensing elements can be modulated at a chopping frequency and the magnetic field sensor can include a demodulator configured to demodulate the amplified signal at the chopping frequency. The chopping frequency can be one-half of the frequency of the first and second time intervals. In embodiments, the plurality of magnetic field sensing elements can include two or three magnetic field sensing elements configured to sense orthogonal magnetic field components. The magnetic field sensor can include a biasing circuit to bias the first one of the plurality of magnetic field sensing elements during the first time interval and to bias the second one of the plurality of magnetic field sensing elements during the second time interval. The reference signal can have a level based on a state of the first comparator output signal during the first time interval and based on a state of the second comparator output signal during the second time interval. The Schmitt trigger circuit can further include a latch having an input coupled to the output of the comparator, a control input, and an output at which an output signal of the magnetic field sensor is provided in response to the first comparator output signal or the second comparator output signal. The magnetic field sensor can further include a digital-to-analog converter (DAC) coupled to a variable resistor and configured to generate the reference signal.

Also described is a method for processing magnetic field signals generated by respective magnetic field sensing elements including generating, with a first magnetic field sensing element, a first magnetic field signal in response to a magnetic field and generating, with a second magnetic field sensing element, a second magnetic signal in response to the magnetic field. The method may further include amplifying, with a front end amplifier, the first signal magnetic signal during a first time interval when the first magnetic field sensing element is coupled to the front end amplifier and amplifying, with the front end amplifier, the second magnetic signal during a second time interval when the second magnetic field sensing element is coupled to the front end amplifier, wherein the second time interval does not overlap with the first time interval, and wherein the front end amplifier is configured to generate an amplified signal. The amplified signal is filtered with a first low pass filter during the first time interval to generate a first low pass filtered signal and with a second low pass filter during the second time interval to generate a second low pass filtered signal. The method may further include processing the first low pass filtered signal and the second low pass filtered signal with a sinc filter to generate an averaged signal and comparing, with a Schmitt trigger circuit, the averaged signal to a reference signal to generate a first comparator output signal during the first time interval and a second comparator output signal during the second time interval.

Features may include one or more of the following individually or in combination with other features. Processing the first low pass filtered signal and the second low pass filtered signal with the sinc filter can include selectively coupling the first low pass filtered signal to at least one first sampling capacitor of the sinc filter to generate a sample of the first low pass filtered signal, selectively coupling the second low pass filtered signal to at least one second sampling capacitor of the sinc filter to generate a sample of the second low pass filtered signal, and averaging the sample of the first low pass filtered signal and the sample of the second low pass filtered signal to generate an averaged signal. The method may further include modulating the first magnetic signal and the second magnetic signal at a chopping frequency and demodulating the amplified signal at the chopping frequency. The chopping frequency can be one-half of the frequency of the first and second time intervals. The first magnetic field sensing element and the second magnetic field sensing element can be configured to sense orthogonal magnetic field components. The method can further include biasing, with the same biasing circuitry, the first magnetic field sensing element during the first time interval and the second magnetic field sensing element during the second time interval. The method can further include providing the reference signal at a level based on a state of the first comparator output signal during the first time interval and based on a state of the second comparator output signal during the second time interval.

BRIEF DESCRIPTION

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
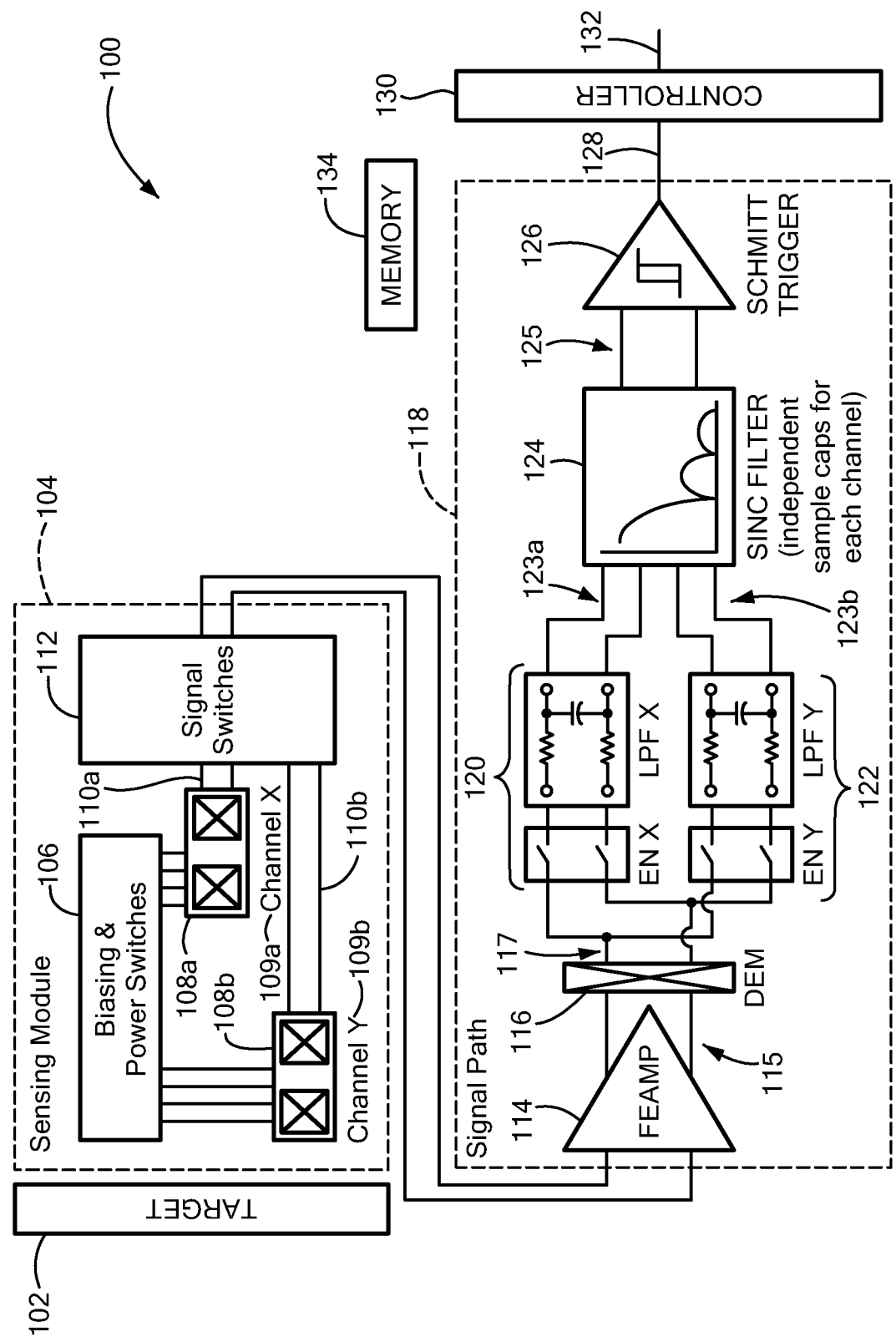
FIG. 1 is a block diagram of a multichannel magnetic field sensor with a multiplexed signal path, according to the present disclosure.

Referring to FIG. 1, a multichannel magnetic field sensor 100 includes a magnetic field sensing module 104 and a multiplexed signal path 118, according to the present disclosure. By multichannel, it is meant that the sensing module 104 includes two or more sensing elements 108a, 108b for sensing a magnetic field, with each sensing element corresponding to a respective channel 109a, 109b. Channels 109a, 109b can utilize sensing elements 108a, 108b that are of the same type or different types and sensing elements 108a, 108b can be positioned proximate to one another or can be spaced from each other, depending on the application.

Aspects of the disclosure are described in connection with a sensor 100 having two channels 109a, 109b configured to sense orthogonal components of a magnetic field. Accordingly, for simplicity, channel 109a can be referred to herein as channel X and channel 109b can be referred to herein as channel Y. It will be appreciated by those or ordinary skill in the art that sensor 100 can include more than two channels. In some embodiments, a third channel can include a sensing element configured to sense a further orthogonal component of the magnetic field, in which case such third channel can be referred to as channel Z. And in other arrangements any number of two or more channels can be provided and such channels need not sense orthogonal components of the magnetic field.

Signals generated by each sensor channel 109a, 109b can be processed by the same circuit elements or circuitry or can be processed by separate circuitry dedicated to a respective channel. According to aspects of the disclosure, a signal path 118 includes both shared and separate circuitry.

The multiplexed signal path 118 includes a front end amplifier 114 and a Schmitt trigger circuit 126 that are shared. Additional elements of the signal path 118 can be separate (i.e., dedicated to a particular channel) such as a first low pass filter 120 that processes signals from channel X 109a and a second low pass filter 122 that processes signals from channel Y 109a or can be shared in part and separate in part, such as a sinc filter 124, as will be explained. Suffice it to say here that sampling capacitors of the sinc filter 124 are separate for each channel, but averaging elements of the filter are shared by the multiple channels.

With this arrangement, the front end amplifier 114 and the Schmitt trigger circuit 126 are shared. The sensor 100 includes separate low pass filters 120, 122 and separate sinc filter sampling capacitors for each channel 109a, 109b. This arrangement provides an increased operating speed as compared to a fully shared signal path (i.e., a signal path in which all elements are shared in a multiplexed manner) and lower cost and reduced circuit area as compared to use of fully redundant signal paths for each channel.

The term "magnetic field sensor" 100 or simply "sensor" is used herein to describe a circuit that includes one or more magnetic field sensing elements, generally in combination with other circuits. Magnetic field sensor 100 can be used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic target or object, a rotation detector (or movement detector) that senses passing articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field.

Sensor 100 is described herein in the context of a magnetic switch; however, it will be appreciated by those of ordinary skill in the art that the described multiplexed signal path 118 and associated methods are not limited to any particular type of multichannel sensor. For example, the described structures and methods can be used in rotation sensors, angle sensors, pressure sensors and temperature sensors to name a few.

The magnetic field sensing module 104 includes magnetic field sensing elements 108a, 108b, each configured to generate a respective magnetic field signal 110a, 110b indicative of a sensed magnetic field. As used herein, the term "magnetic field signal" is used to describe any signal that results from a magnetic field experienced by a magnetic field sensing element. Sensing element 108a can correspond to channel X 109a and sensing element 108b can correspond to channel Y 109b.

The sensed magnetic field can be generated by and/or affected by a proximate target 102. Example target 102 can take the form of a ring magnet having magnetic domains or a ferromagnetic object (e.g., gear teeth) where a back-bias or other magnet generates the magnetic field that is affected by movement of the target.

Each of the magnetic field sensing elements 108a, 108b can be, but is not limited to, a Hall effect element, a magnetoresistance element, an inductive coil, or a magnetotransistor and can include one or more such elements of the same or different types. Use of the same type of magnetic field sensing elements 108a, 108b can have the advantage of matching the amplifier gain given that the front end amplifier 114 is shared. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

In an example, each magnetic field sensing element 108a, 108b is a vertical Hall plate coupled to receive bias, or drive signals from a biasing module 106, as shown. While each sensing element 108a, 108b is shown as a dual Hall plate, it will be appreciated by those of ordinary skill in the art that each element may include only a single Hall plate or more than two Hall plates.

Hall plates 108a, 108 can implement chopping. To this end, terminals of the Hall plates 108a, 108b are interchanged by switches under control of a chopping clock signal at a chopping frequency so that during subsequent chopping phases (e.g., Phase I and Phase II), bias terminals (i.e., drive terminals) and output terminals (i.e., signal contact terminals) of the Hall plates 108a, 108b are interchanged. In other words, selected drive and signal contact pairs are interchanged during each phase of the chopping and offset voltages of the different driving arrangements tend to cancel toward zero. Such modulation of the magnetic field signals 110a, 110b results in conversion of the sensed magnetic field to a relatively high chopping frequency without modulating any offset which thus, remains at DC. Example chopping frequencies can be on the order of 500 KHz.

Figure 4:
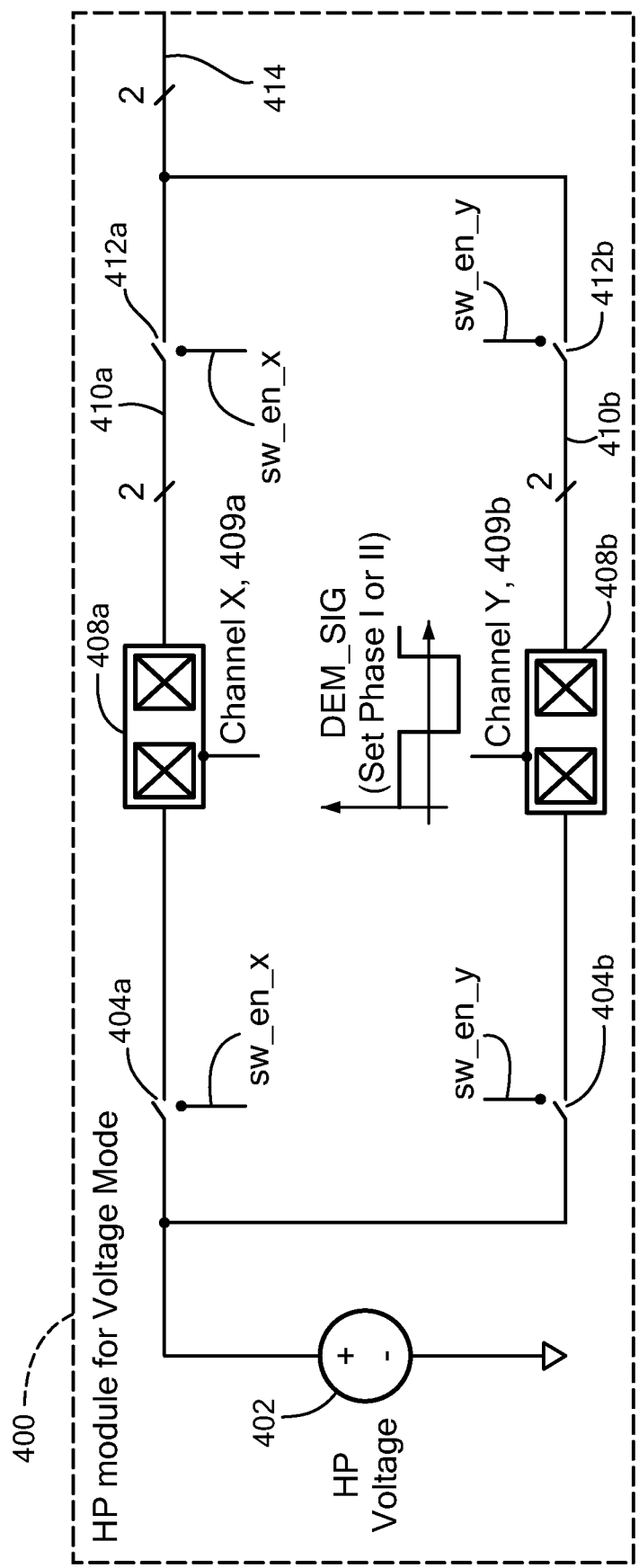
FIG. 4 shows an example magnetic field sensing element module including shared bias circuitry according to an embodiment.
Figure 5:
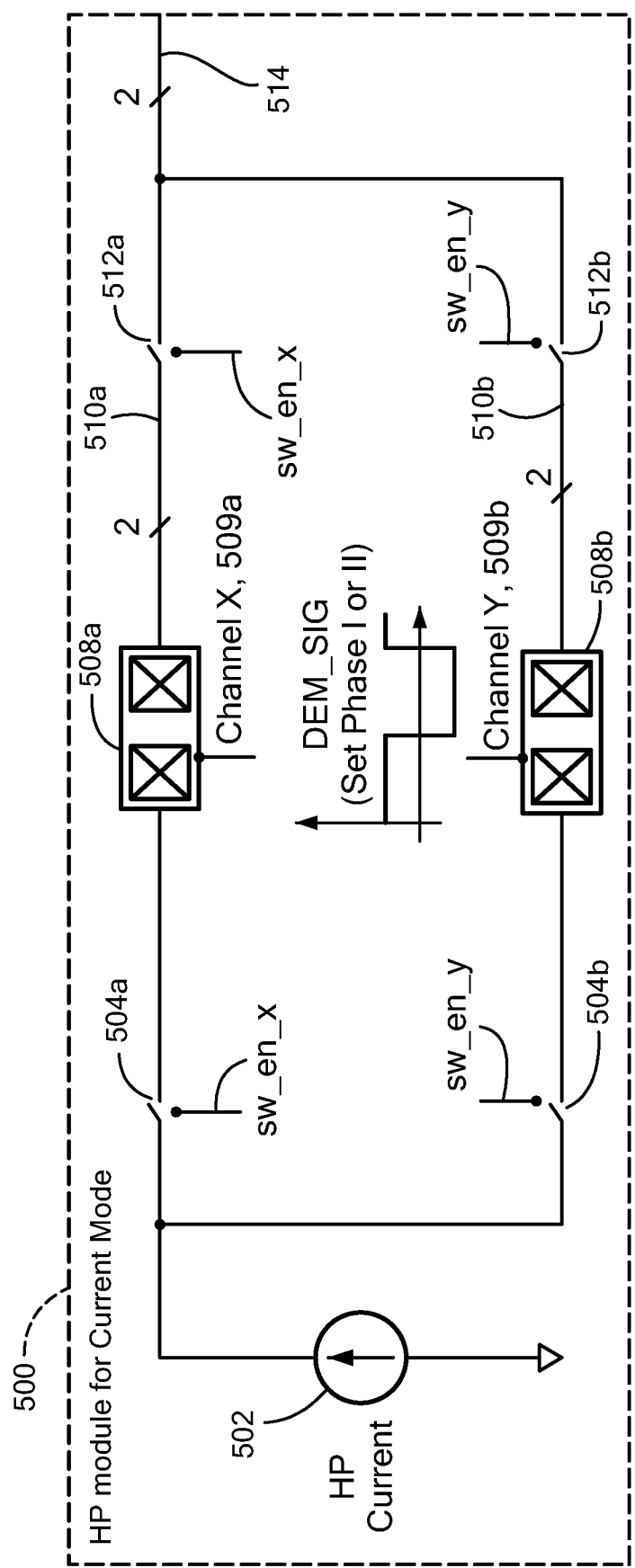
FIG. 5 shows another example magnetic field sensing element module including shared bias circuitry according to an alternative embodiment.

As will be explained in connection with FIGS. 4 and 5, according to an aspect of the disclosure, module 106 can include power switches controlled to provide shared (i.e., multiplexed) biasing to the magnetic field sensing elements 108a, 108b, in the form of a bias voltage (FIG. 4) or a bias current (FIG. 5). To this end, switches of module 106 can function to selectively couple the bias source to the sensing elements 108a, 108b during different, non-overlapping time intervals. For example, a bias source can be coupled to sensing element 108a during a first time interval and to sensing element 108b during a second time interval that does not overlap with the first time interval.

Signal switches 112 include switches that are controlled to selectively couple each of the Hall plates 108a, 108b to the signal path 118 during a different, non-overlapping time interval. Thus, signal switches 112 can be described as performing a multiplexing function. For example, the first magnetic field signal 110a can be coupled to the signal path 118 by switches 112 during a first time interval and the second magnetic field signal 110b can be coupled to the signal path 118 by switches 112 during a second time interval that does not overlap with the first time interval. These first and second time intervals can be the same as the first and second time intervals at which switches of module 106 couple a bias source to the respective Hall plates 108a, 108b. In general, the first time interval as used herein can be a time interval during which channel X 109a is processed, or enabled and the second time interval as used herein can be a time interval during which channel Y 109b is processed, or enabled.

The multiplexing performed by signal switches 112 can be such that during each chopping phase, each of the Hall plates 108a, 108b is coupled to the signal path 118 for a portion of the chopping phase. In other words, the first time interval can correspond to a first portion of the first chopping phase and the second time interval can correspond to a second portion of the first chopping phase. Stated differently, each phase of a chopping cycle includes both the first time interval during which the signal path 118 is coupled to receive the first magnetic field signal 110a and also the second time interval during which the signal path is coupled to receive the second magnetic field signal 110b. Thus, the first time interval (i.e., during which the first Hall plate 108a is coupled to the signal path 118) occurs at a first frequency, the second time interval (i.e., during which the first Hall plate 108a is coupled to the signal path 118) occurs at the same, first frequency and the chopping frequency is one-half of the first frequency.

Front end amplifier 114 is coupled to signal switches 112 to receive the first magnetic field signal 110a during the first time interval and to receive the second magnetic field signal 110b during the second time interval. The front end amplifier 114 is configured to generate an amplified signal 115.

A demodulator 116 is coupled to receive the amplified signal 115 and perform demodulation at the chopping frequency. The resulting demodulated signal 118 has the magnetic field component converted to baseband and the amplified offset is modulated to the relatively high chopping frequency.

Low pass filters 120, 122 are configured to process the demodulated signal 117 in order to remove the undesired offset at the chopping frequency without affecting the magnetic field signal. The first low pass filter 120 is configured to process the magnetic field signal 110a generated the first channel 109a and the second low pass filter 122 is configured to process the magnetic field signal 110b generated by the second channel 109b. To this end, during the first time interval when the first magnetic field signal 110a is coupled to the front end amplifier 114, low pass filter 120 processes the demodulated signal 117 to generate a first low pass filtered signal 123a and during the second time interval when the second magnetic field signal 110b is coupled to the front end amplifier 114, low pass filter 122 processes the demodulated signal 117 to generate a second low pass filtered signal 123b. Each of the low pass filters 120, 122 includes switches (labelled EN X, EN Y) for coupling the demodulated signal 117 to the respective low pass filter (labeled LPF X, LPF Y) during respective time intervals, as will be explained further below. Suffice it to say here that the EN X switches can be closed during the above-described first time interval during which channel X 109a is processed, or enabled and the EN Y switches can be closed during the above-described second time interval during which channel Y 109b is processed, or enabled Sinc filter 124 processes the low pass filtered signals 123a, 123b in order to sample and average the input signals so as to generate a notch response at the chopping frequency to remove any remaining offset. Sinc filter 124 functions to average two or more samples of the magnetic field signal in order to remove any of the filtered Hall Plate offset and front-end amplifier offset, which are at the chopping frequency. The sinc filter output can be referred to as an averaged signal 125.

To this end, sinc filter 124 can include separate sampling capacitors dedicated to each channel 109a, 109b and has a first input coupled to receive the first low pass filtered signal 123a during the first time interval and a second input coupled to receive the second low pass filtered signal 123b during the second time interval.

Schmitt trigger circuit 126 includes a comparator having a first input coupled to receive the averaged signal 125, a second input coupled to receive a reference signal, and an output 128 at which a first comparator output signal is provided during the first time interval and a second comparator output signal is provided during the second time interval. Aspects of sensor 100 are described in greater detail below. Suffice it to say here that in operation, Schmitt trigger circuit 126 is configured to generate an output signal that changes state in response to the averaged signal 125 crossing certain reference signal, or threshold levels.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

A controller 130, as may be a digital controller can be coupled to an output of the Schmitt trigger circuit 126 and can generate a sensor output signal 132. The sensor output signal 132 can take various forms, such as a voltage signal in the case of a so-called three-wire output configuration as shown or a current signal in the case of a so-called two-wire output in which the output signal information is provided in the form of current pulses on the power and ground connections to the sensor. Also, it will be appreciated that various sensor output signal formats are possible. A memory 134 can be configured to store various data such as configuration parameters.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

In embodiments including more than two channels, an additional low pass filter for each additional channel can be provided and additional dedicated sinc filter sampling capacitors for each additional channel can be provided. Further, as explained above, the multiplexing of the channels 109a, 109b by enable signals sw_en_x and sw_en_y is such that each channel is enabled for a respective portion of each chopping phase. In embodiments including more than two channels, additional channel enable signals can be provided such that each channel is enabled during each chopping phase.

Figure 2:
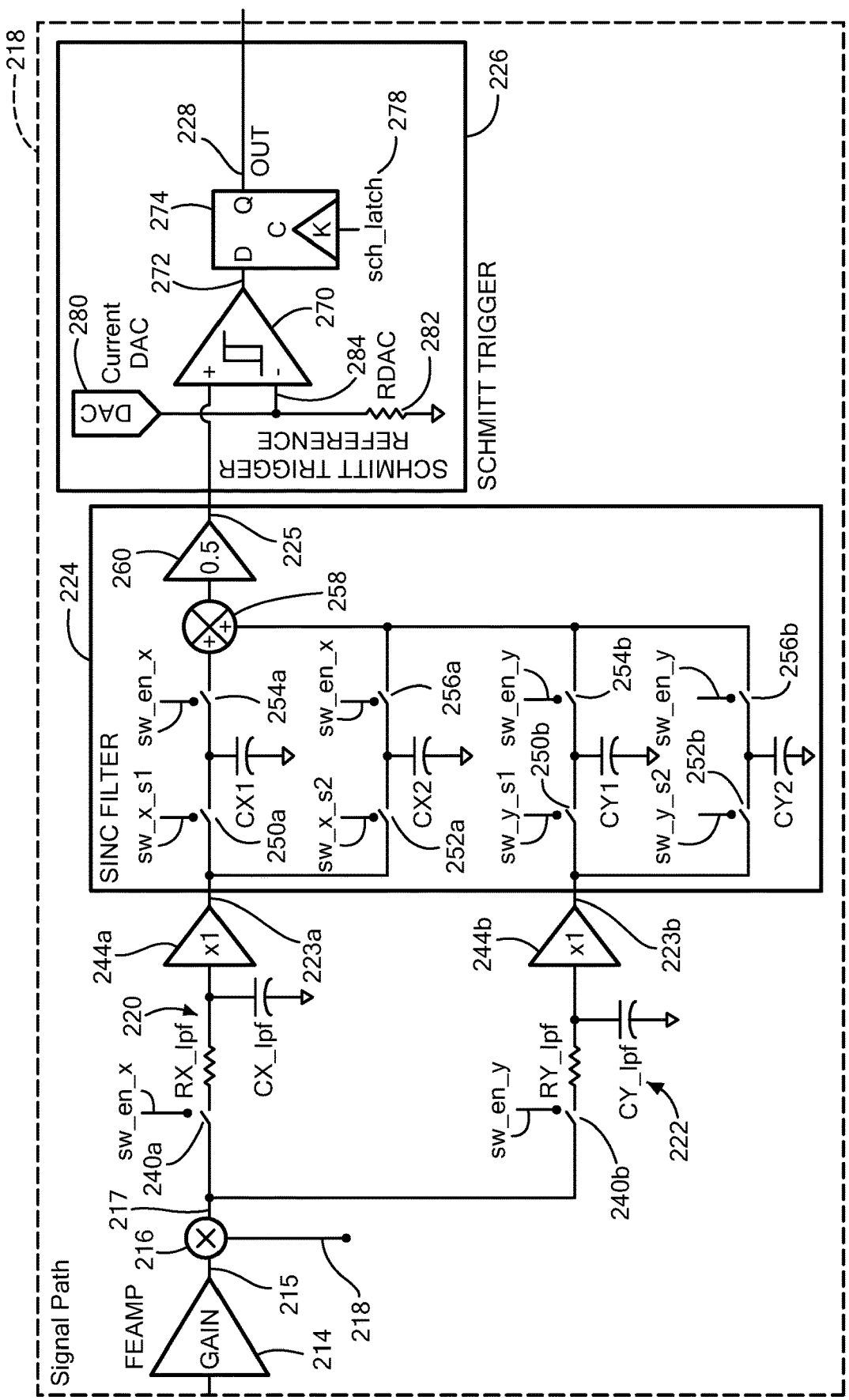
FIG. 2 is a schematic of the multiplexed signal path of FIG. 1.

Referring also to FIG. 2, a more detailed multiplexed signal path 218 is shown. Signal path 218 can be the same as or similar to signal path 118 of FIG. 1. Accordingly, signal path 218 includes a front end amplifier 214, a demodulator 216, a first low pass filter 220, a second low pass filter 222, a sinc filter 224, and a Schmitt trigger circuit 226. Although the signal path 218 of FIG. 2 illustrates single-ended signals for simplicity, it will be appreciated that the same concepts can be applied to differential signals such as shown in FIG. 1.

The frond end amplifier 214 is multiplexed such that during the first time interval, it is coupled to receive a magnetic field signal from a first channel (e.g., signal 110a from channel 109a) and during the second time interval, it is coupled to receive a magnetic field signal from a second channel (e.g., signal 110b from channel 109b). Amplifier 214 generates an amplified signal 215. The first and second time intervals are as described above, generally as non-overlapping complementary signals.

Figure 3:
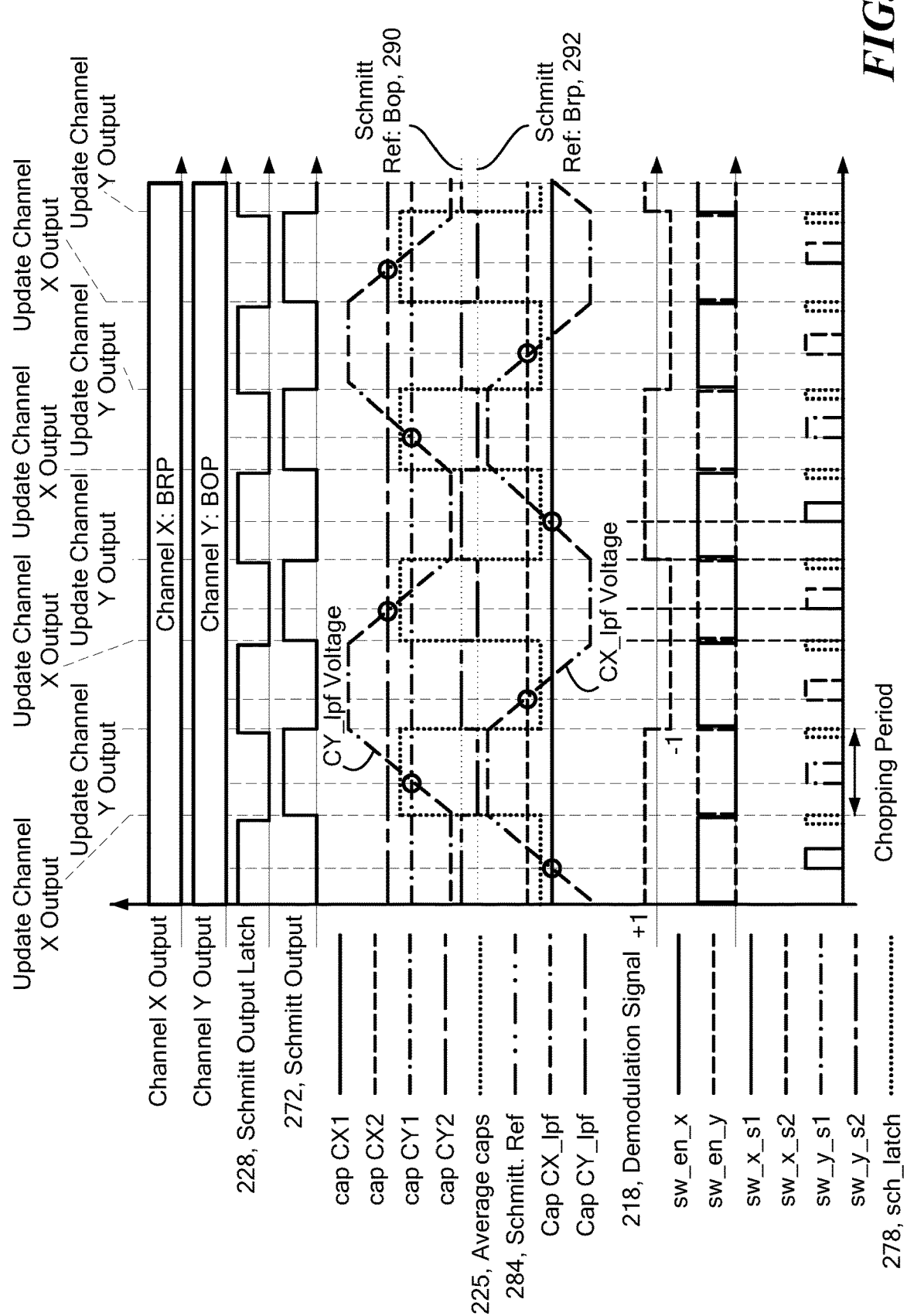
FIG. 3 is shows example signals associated with the multiplexed signal path of FIG. 2.

Operation of the multiplexed signal path 218 is explained with reference to example signals shown in FIG. 3. Suffice it to say here that FIG. 3 illustrates example control signals, as may be generated by clock logic under the control of a controller, such as controller 132 of FIG. 1, that control various sensor functionality. Control signals include the sch_latch signal 278 for coupling to the latch 274. The latch 274 can be updated on the rising edge of the sch_latch pulses and the respective sensor output 228 can be latched on the falling edge of the sch_latch pulses. Additional control signals are associated with low pass filter switches and sinc filter switches, as will be explained.

Demodulator 216 demodulates the amplified signal 215 according to a demodulation signal 218 that can be the same as or similar to the chopping clock signal by which the Hall plates 108a, 108b are chopped. An example demodulation signal 218 is shown in FIG. 3 to include alternating first and second phases (e.g., Phases I when the demodulation signal is at +1 and Phases II when the demodulation signal is at −1). Operation of the demodulator 216 brings the signal indicative of the sensed magnetic field back to baseband and modulates any offset to the chopping frequency.

The demodulated signal 217 is selectively coupled to the first and second low pass filters 220, 222 by operation of respective switches 240a, 240b that are controlled by respective switch enable signals sw_en_x, sw_en_y. Switch 240a is controlled by the sw_en_x signal and switch 240b is controlled by the sw_en_y signal. Example switch enable signals sw_en_x and sw_en_y are shown in FIG. 3. Suffice it to say here that such control signals sw_en_x, sw_en_y establish the first time interval during which the magnetic field signal 110a generated by channel X 109a is processed and the second time interval during which the magnetic field signal 110b generated by channel Y 109b is processed. For example, signal sw_en_x can be high for a first time interval and sw_en_y can be high during a second time interval following the first time interval and such first and second time intervals can repeat in this non-overlapping, complementary fashion, as shown. Thus, during each chopping phase, sw_en_x is high for the first half of the phase and sw_en_y is high during the second half of the phase.

The first low pass filter 220 includes a resistor RX_lfp and a capacitor CX_lpf coupled as shown and further coupled to a buffer amplifier 244a. Similarly, the second low pass filter 222 includes a resistor RY_lpf and a capacitor CY_lpf coupled as shown and further coupled to a buffer amplifier 244b. The output signal of buffer amplifier 244a provides a first low pass filtered signal 223a and the output signal of buffer amplifier 244b provides a second low pass filtered signal 223b.

Example voltages across the low pass filter capacitors CX_lpf, CY_lpf are shown in FIG. 3 as labeled Cap CX_lpf, Cap CY_lpf, respectively. In operation, during the first time interval when sw_en_x is high (i.e., switch 240a is closed) and sw_en_y is low (i.e., switch 240b is open), capacitor CX_lpf is charged and the voltage across capacitor CY_lpf remains constant. During the second time interval when sw_en_x is low (i.e., switch 240a is open) and switch sw_en_y is high (i.e., switch 240b is closed), the voltage on capacitor CX_lpf remains constant and capacitor CY_lpf is charged. During the next, first time interval when sw_en_x is high and sw_en_y is low, capacitor CX_lpf is discharged and the voltage on capacitor CY_lpf remains constant, as shown.

The sinc filter 224 includes separate sampling capacitors dedicated to each channel 109a, 109b but shared averaging elements 258, 260. In particular, for channel 109a, sinc filter 224 includes a first sampling capacitor CX1 and a second sampling capacitor CX2 and for channel 109b, sinc filter 224 includes a first sampling capacitor CY1 and a second sampling capacitor CY2. The first low pass filtered signal 223a is selectively coupled to sampling capacitors CX1, CX2 by respective switches 250a, 252a each controlled by a respective switch control signal sw_x_s1, sw_x_s2, as shown. And the second low pass filtered signal 223b is selectively coupled to sampling capacitors CY1, CY2 by respective switches 250b, 252b each controlled by a respective switch control signal sw_y_s1, sw_y_s2, as shown. Example switch control signals sw_x_s1, sw_x_s2, sw_y_s1, sw_y_s2 are shown in FIG. 3.

In operation, during the first time intervals when channel X 109a is enabled (i.e., when sw_x_s1 and sw_x_s2 pulses occur), capacitors CX1, CX2 are charged and during the second time intervals when channel Y 109b is enabled (i.e., when sw_y_s1 and sw_y_s2 pulses occur), capacitors CY1, CY2 are charged. This operation is illustrated by example switch enable signals sw_x_s1, sw_x_s2, sw_y_s1, sw_y_s2 that show that switch 250a is closed for a portion of the first time interval, switch 252a is closed for a portion of the second time interval, switch 250b is closed for a portion of the next, first time interval, and switch 252b is closed for a portion of the next, second time interval. Stated differently, during each chopping phase, either capacitors CX1, CY1 are charged or capacitors CX2, CY2 are charged.

As will become apparent, after each sample is taken, the output of the channel associated with the sample is updated by latching the output of the Schmitt trigger comparator.

It will be appreciated by those of ordinary skill in the art that although the illustrated sinc filter 224 includes two sampling capacitors per channel, more or fewer sampling capacitors are possible. It will also be appreciated that filter circuit 124 may be a sinc filter or other appropriate filtering circuit including but not limited to a finite impulse response (FIR) filter.

Averaging elements 258, 260 operate to average the charge on the X channel capacitors CX1, CX2 and subsequently on the Y channel capacitors CY1, CY2. For example, when channel X 109a is enabled and channel Y 109b is disabled, the voltages across capacitors CX1, CX2 are summed by element 258 and divided by two by element 260. Similarly, when channel X 109a is disabled and channel Y 109b is enabled, the voltages across capacitors CY1, CY2 are summed by element 258 and divided by two by element 260. Thus, during the first time intervals, the averaged signal 225 is the average of samples of the voltages across capacitors CX1 and CX2 and thus, it is the average of these samples that is compared to a reference signal by the Schmitt trigger circuit 226. During the second time intervals, the averaged signal 225 is the average of samples of the voltages across capacitors CY1 and CY2 and thus, it is the average of these samples that is compared to a reference signal by the Schmitt trigger circuit 226. It will be appreciated that in embodiments with more than two channels, the averaging elements will include summation of sampled signals and division by the number of channels.

An example waveform associated with the averaging operation of elements 258, 260 is shown in FIG. 3 and labeled Average caps. Such signal can correspond to signal 225 of FIG. 2.

The Schmitt trigger circuit 226 can be the same as or similar to Schmitt trigger circuit 126 of FIG. 1 and thus, includes a comparator 270 having a first input coupled to receive the averaged signal 225, a second input coupled to receive a reference, or threshold signal 284, and an output at which a comparator output signal 272 is provided in the form of a first comparator output signal during the first time interval and a second comparator output signal during the second time interval.

The reference signal 284 can be provided at a node between a series-coupled current digital-to-analog converter (DAC) 280 and resistor 282. In other words, the reference signal 284 can be generated by the current from current DAC 280 passing through the resistor 282.

The reference signal 284 is changed between an operate point (Bop, the level of a strengthening magnetic field at which the sensor switches on) and a release point (Brp, the level of a weakening magnetic field at which the sensor switches off) by a controller (e.g., controller 132 in FIG. 1) according to the state of the comparator output. The difference between the Bop and Brp reference voltage levels corresponds to the hysteresis of the sensor and permits clean output switching even in the presence of mechanical vibration and electrical noise.

The reference signal 284 can be varied by changing either the amount of current sourced by the DAC 280 or by changing the value of resistor 282. In this way, the reference signal 284 can be set to a predetermined threshold, such as the operate point Bop threshold 290 or the release point Brp threshold 292. As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

The reference signal 284 can be set to Bop or Brp based on the state of the enabled channel's output, as will be explained. Suffice it to say here that if the channel output is indicated as being Brp (as illustrated in FIG. 3 for Channel X), then the Schmitt reference 284 is set to the Bop level 290 since that is the comparison that will cause the comparator output 272 to switch and conversely if the channel output is indicated as being Bop (as illustrated in FIG. 3 for Channel Y), then the Schmitt reference 284 is set to the Brp level 292 since that is the comparison that will cause the comparator output 272 to switch.

In an example, if the average signal 225 is less than the Schmitt trigger reference 284, then the Schmitt output 272 is at a logic low level; whereas, if the average signal 225 is greater than the Schmitt trigger reference 284, then the Schmitt output 272 is at a logic high level.

The Schmitt trigger circuit 226 includes a latch 274 having an input coupled to receive the comparator output signal 272, an output at which an output signal 228 is provided, and a clock input responsive to the sch_latch signal. The output 272 of the comparator 222 is latched at each rising edge of the sch_latch pulses (shown in FIG. 3) and the state of the respective channel output is updated at the falling edge of the sch_latch pulses.

An example sch_latch signal is shown in FIG. 3 by which the latch 274 is updated on the rising edge of the sch_latch pulses and the respective channel output signal 228 is updated on the falling edges of the sch_latch pulses. Thus, upon a first falling edge of the sch_latch signal, an output signal associated with a first channel (channel X) is updated and upon a next falling edge of the sch_latch signal, an output signal associated with a second channel (channel Y) is updated, and this sequence continues for subsequent falling edges of the sch_latch signal, as shown.

As noted above, the reference signal 284 has a level based on a state of the first comparator output signal during the first time interval when the X channel 109a is enabled and based on a state of the second comparator output signal during the second time interval when the Y channel 109b is enabled. Example waveforms illustrating this operation are shown in FIG. 3. A Channel X Output corresponds to a state of channel X 109a and a Channel Y Output corresponds to a state of channel Y 109b. Specifically, channel X 109a is below the release point Brp (labeled 292 in FIG. 3) and thus, the reference signal 284 is set to look for the next operate point Bop crossing and channel Y 109b is above the operate point Bop (labeled 290 in FIG. 3) and thus, is set to look for the next release point Brp crossing. Thus, when processing the first channel 109a, the reference signal 284 coupled to comparator 270 is set for Bop and when processing the second channel 109b, the reference signal 284 coupled to comparator 270 is set for Brp. In this way, the reference signal 284 has a level based on a state of the first comparator output signal during the first time interval and based on a state of the second comparator output signal during the second time interval.

The output signal 228 of the Schmitt trigger latch 274 is coupled to a controller that can be the same as or similar to controller 130 of FIG. 1, with which an output signal of the sensor can be provided.

With the described arrangement including separate low pass filters 220, 222 for each channel 109a, 109b, speed of operation of the sensor is improved as compared to a fully shared signal path in which all elements of the signal path are shared. In such fully shared signal path arrangements, it can take as long as approximately 20-25 microseconds to charge the low pass filter capacitor, thereby requiring as much as 50 microseconds for both channel output signals to be updated. By providing separate low pass filters 220, 222 for each channel 109a, 109b, each channel output signal can be updated as quickly as approximately 2 microseconds. Furthermore, the described arrangement has a lower cost and reduced circuit area as compared to providing fully redundant signal paths for each channel.

Referring to FIG. 4, according to an aspect of the disclosure, a sensing module 400 implementing shared (i.e., multiplexed) biasing can provide the sensing module 104 of sensor 100 (FIG. 1). With sensing module 400, each of the magnetic field sensing elements is biased by the same source, at a different, non-overlapping times.

Sensing module 400 includes two or more sensing elements 408a, 408b for sensing a magnetic field, with each sensing element configured to generate a respective magnetic field signal 410a, 410b indicative of a sensed magnetic field and corresponding to a respective channel 409a, 409b. Example sensing elements 408a, 408b are Hall plates configured to sense orthogonal magnetic field components. Thus, channel 409a can be referred to as an X channel and channel 409b can be referred to as a Y channel. It will be appreciated by those or ordinary skill in the art that sensing module 400 can include more than two channels.

The magnetic field sensor can include a biasing source 402 to bias the first one of the sensing elements 408a during the first time interval and to bias the second one of the sensing elements 408b during the second time interval.

The bias source 402 can take the form of a voltage source.

Switches 404a, 404b are coupled between the bias source 402 and respective sensing elements 408a, 408b, as shown. Switches 404a, 404b are controlled by switch enable signals sw_en_x, sw_en_y, respectively. As described above, switch enable signals sw_en_x, sw_en_y establish the first time interval during which the magnetic field signal generated by channel 409a is processed and the second time interval during which the magnetic field signal generated by channel 409b is processed. Switch enable signal sw_en_x can be high for a first time interval and sw_en_y can be high during a second time interval following the first time interval and such first and second time intervals can repeat in this non-overlapping, complementary fashion, as shown.

Sensing module 400 can implement chopping under the control of a chopping clock signal (labeled DEM_SIG, and as may correspond to the example demodulation signal 218 of FIG. 3) coupled to the Hall plates 408a, 408b. The chopping clock signal has a chopping frequency so that during subsequent chopping phases, bias terminals (i.e., drive terminals) and output terminals (i.e., signal contact terminals) of the Hall plates 408a, 408b are interchanged. In other words, selected drive and signal contact pairs are interchanged during each phase of the chopping and offset voltages of the different driving arrangements tend to cancel toward zero. Such modulation of the magnetic field signals 410a, 410b results in conversion of the sensed magnetic field to a relatively high chopping frequency without modulating any offset which thus, remains at DC.

As explained above, during each chopping phase, sw_en_x is high for half of the phase and sw_en_y is high during the remainder of the phase. Thus, the chopping frequency can be one-half of the frequency at which the first and second time intervals occur.

Signal switches 412a, 412b are controlled to selectively coupled each of the Hall plates 408a, 408b to the signal path (e.g., signal path 118 of FIG. 1 and signal path 218 of FIG. 2) during a different, non-overlapping time interval. Switches 412a, 412b can be controlled by the switch enable signals sw_en_x, sw_en_y, respectively. With this arrangement, the first magnetic field signal 410a is coupled to the signal path by switch 412a during a first time interval and the second magnetic field signal 410b is coupled to the signal path by switch 412b during a second time interval that does not overlap with the first time interval.

The multiplexing performed by signal switches 412a, 412b is such that during each chopping phase, each of the Hall plates 408a, 408b is coupled to the signal path for a portion (e.g., half) of the chopping phase. In other words, the first time interval can correspond to a first portion of the first chopping phase and the second time interval can correspond to a second portion of the first chopping phase. Thus, the first time interval (i.e., during which the first Hall plate 408a is coupled to the signal path) occurs at a first frequency, the second time interval (i.e., during which the first Hall plate 408a is coupled to the signal path) occurs at the same, first frequency and the chopping frequency is one-half of the first frequency.

Referring to FIG. 5, according to an aspect of the disclosure, a sensing module 500 implementing shared (i.e., multiplexed) biasing can provide the sensing module 104 of sensor 100 (FIG. 1). With sensing module 500, each of the magnetic field sensing elements is biased by the same source, at a different, non-overlapping times.

Sensing module 500 includes two or more sensing elements 508a, 508b for sensing a magnetic field, with each sensing element configured to generate a respective magnetic field signal 510a, 510b indicative of a sensed magnetic field and corresponding to a respective channel 509a, 509b. Example sensing elements 508a, 508b are Hall plates configured to sense orthogonal magnetic field components. Thus, channel 509a can be referred to as an X channel and channel 509b can be referred to as a Y channel. It will be appreciated by those or ordinary skill in the art that sensing module 500 can include more than two channels.

The magnetic field sensor can include a biasing source 502 to bias the first one of the sensing elements 508a during the first time interval and to bias the second one of the sensing elements 508b during the second time interval.

Sensing module 500 differs from sensing module 400 of FIG. 4 in that the bias source 502 is a current source.

Switches 504a, 504b are coupled between the bias source 502 and respective sensing elements 508a, 508b, as shown. Switches 504a, 504b can be controlled by switch enable signals sw_en_x, sw_en_y, respectively, as described above.

Sensing module 500 can implement chopping under the control of a chopping clock signal (labeled DEM_SIG, and as may correspond to the example demodulation signal 218 of FIG. 3) coupled to the Hall plates 508a, 508b, as described above in connection with Hall plates 408a, 408b.

Signal switches 512a, 512b are controlled to selectively coupled each of the Hall plates 508a, 508b to the signal path (e.g., signal path 118 of FIG. 1 and signal path 218 of FIG. 2) during a different, non-overlapping time interval, as explained above in connection with control of switches 412a, 412b.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:
1. A magnetic field sensor comprising:
a plurality of magnetic field sensing elements, each configured to generate a respective magnetic field signal indicative of a sensed magnetic field;
a front end amplifier coupled to receive a first magnetic field signal during a first time interval when a first one of the plurality of magnetic field sensing elements is coupled to the front end amplifier and to receive a second magnetic field signal during a second time interval when a second one of the plurality of magnetic field sensing elements is coupled to the front end amplifier, wherein the second time interval does not overlap with the first time interval, and wherein the front end amplifier is configured to generate an amplified signal;

a first low pass filter configured to process the amplified signal during the first time interval and generate a first low pass filtered signal;

a second low pass filter configured to process the amplified signal during the second time interval and generate a second low pass filtered signal;

a sinc filter having a first input coupled to receive the first low pass filtered signal during the first time interval and a second input coupled to receive the second low pass filtered signal during the second time interval, wherein the sinc filter comprises an averaging element that is configured to generate an averaged signal based on the first and second low pass filtered signals; and a Schmitt trigger circuit comprising a comparator having a first input coupled to receive the averaged signal, a second input coupled to receive a reference signal, and an output at which a first comparator output signal is provided during the first time interval and a second comparator output signal is provided during the second time interval.

2. The magnetic field sensor of claim 1, wherein the sinc filter comprises:

at least one first sampling capacitor;

at least one first filter switch configured to be closed to couple the first low pass filtered signal to the at least one first sampling capacitor or to be open to decouple the first low pass filtered signal from the at least one first sampling capacitor;

at least one second sampling capacitor; and at least one second filter switch configured to be closed to couple the second low pass filtered signal to the at least one second sampling capacitor or to be open to decouple the second low pass filtered signal from the at least one second sampling capacitor.

3. The magnetic field sensor of claim 1, wherein the magnetic field signal generated by each of the magnetic field sensing elements is modulated at a chopping frequency and wherein the magnetic field sensor further comprises a demodulator configured to demodulate the amplified signal at the chopping frequency.

4. The magnetic field sensor of claim 3, wherein the first time interval occurs at a first frequency, the second time interval occurs at the first frequency and the chopping frequency is one-half of the first frequency.

5. The magnetic field sensor of claim 1, wherein the plurality of magnetic field sensing elements comprises two magnetic field sensing elements configured to sense orthogonal magnetic field components.

6. The magnetic field sensor of claim 1, wherein the plurality of magnetic field sensing elements comprises three magnetic field sensing elements configured to sense orthogonal magnetic field components.

7. The magnetic field sensor of claim 1, further comprising a biasing circuit to bias the first one of the plurality of magnetic field sensing elements during the first time interval and to bias the second one of the plurality of magnetic field sensing elements during the second time interval.

8. The magnetic field sensor of claim 1, wherein the reference signal has a level based on a state of the first comparator output signal during the first time interval and based on a state of the second comparator output signal during the second time interval.

9. The magnetic field sensor of claim 1, wherein the Schmitt trigger circuit further comprises a latch having an input coupled to the output of the comparator, a control input, and an output at which an output signal of the magnetic field sensor is provided in response to the first comparator output signal or the second comparator output signal.

10. The magnetic field sensor of claim 1, further comprising a digital-to-analog converter (DAC) coupled to a variable resistor and configured to generate the reference signal.

11. A method for processing magnetic field signals generated by respective magnetic field sensing elements, comprising:

generating, with a first magnetic field sensing element, a first magnetic field signal in response to a magnetic field;

generating, with a second magnetic field sensing element, a second magnetic signal in response to the magnetic field;

amplifying, with a front end amplifier, the first signal magnetic signal during a first time interval when the first magnetic field sensing element is coupled to the front end amplifier and amplifying, with the front end amplifier, the second magnetic signal during a second time interval when the second magnetic field sensing element is coupled to the front end amplifier, wherein the second time interval does not overlap with the first time interval, and wherein the front end amplifier is configured to generate an amplified signal;

filtering the amplified signal with a first low pass filter during the first time interval to generate a first low pass filtered signal;

filtering the amplified signal with a second low pass filter during the second time interval to generate a second low pass filtered signal;

processing the first low pass filtered signal and the second low pass filtered signal with a sinc filter to generate an averaged signal; and comparing, with a Schmitt trigger circuit, the averaged signal to a reference signal to generate a first comparator output signal during the first time interval and a second comparator output signal during the second time interval.

12. The method of claim 11, wherein processing the first low pass filtered signal and the second low pass filtered signal with the sinc filter comprises:

selectively coupling the first low pass filtered signal to at least one first sampling capacitor of the sinc filter to generate a sample of the first low pass filtered signal; and selectively coupling the second low pass filtered signal to at least one second sampling capacitor of the sinc filter to generate a sample of the second low pass filtered signal; and averaging the sample of the first low pass filtered signal and the sample of the second low pass filtered signal to generate an averaged signal.

13. The method of claim 11, further comprising modulating the first magnetic signal and the second magnetic signal at a chopping frequency and demodulating the amplified signal at the chopping frequency.

14. The method of claim 13, wherein the first time interval occurs at a first frequency, the second time interval occurs at the first frequency, and the chopping frequency is one-half of the first frequency.

15. The method of claim 11, wherein the first magnetic field sensing element and the second magnetic field sensing element are configured to sense orthogonal magnetic field components.

16. The method of claim 11, further comprising biasing, with the same biasing circuitry, the first magnetic field sensing element during the first time interval and the second magnetic field sensing element during the second time interval.

17. The method of claim 11, further comprising providing the reference signal at a level based on a state of the first comparator output signal during the first time interval and based on a state of the second comparator output signal during the second time interval.

* * * * *

UNITED STATES PATENT AND TRADEMARK OFFICE
CERTIFICATE OF CORRECTION

PATENT NO. : 11,768,259 B1
APPLICATION NO. : 17/930463
DATED : September 26, 2023
INVENTOR(S) : Ezequiel Rubinsztain et al.

Page 1 of 1

It is certified that error appears in the above-identified patent and that said Letters Patent is hereby corrected as shown below:

In the Specification

Column 3, Lines 5-6 delete "signal magnetic signal" and replace with --magnetic signal--.

Column 4, Line 30 delete "those or" and replace with --those of--.

Column 7, Line 26 delete "generated the first" and replace with --generated by the first--.

Column 12, Line 58 delete "at a different," and replace with --at different,--.

Column 13, Line 1 delete "those or" and replace with --those of--.

Column 13, Line 42 delete "coupled" and replace with --couple--.

Column 14, Line 3 delete "at a different," and replace with --at different,--.

Column 14, Line 13 delete "those or" and replace with --those of--.

Column 14, Line 31 delete "coupled" and replace with --couple--.

In the Claims

Column 16, Lines 18-19 Claim 11, delete "signal magnetic signal" and replace with --magnetic signal--.

Column 16, Lines 47-48 Claim 12, delete "signal; and" and replace with --signal;--.

Signed and Sealed this
Eighth Day of October, 2024

Katherine Kelly Vidal
*Director of the United States Patent and Trademark Office*